United States Patent [19]

Keller et al.

[11] Patent Number: 5,041,789

[45] Date of Patent: Aug. 20, 1991

[54] MAGNETIC-RESONANCE INSTRUMENT EMPLOYING BARCODE EXPERIMENT SPECIFICATION

[75] Inventors: Tony Keller, Reinstetten-Forchheim; Gunther R. Laukien, Rheinstetten; Manfred Spraul, Ettlingen, all of Fed. Rep. of Germany

[73] Assignee: Bruker Analytische Messtechnik GmbH, Rheinstetten, Fed. Rep. of Germany

[21] Appl. No.: 292,703

[22] Filed: Jan. 3, 1989

[51] Int. Cl.$^5$ ............................................. G01R 33/20
[52] U.S. Cl. ..................................... 324/318; 324/322
[58] Field of Search ....................... 324/300, 307, 318; 128/653; 235/375, 472, 487, 494; 364/413.01, 413.13

[56] References Cited

U.S. PATENT DOCUMENTS 4,191,919 3/1980 Haney et al. ........................ 324/307
4,323,773 4/1982 Carpenter ............................ 235/375

FOREIGN PATENT DOCUMENTS 0197791 10/1986 European Pat. Off. .

OTHER PUBLICATIONS

K. Roth, NMR-Tomographie und-Spektroskopie in der Medizin, Eine Einfuhrung, Springer-Verlag, 1984.
Klinische Kernspintomographie, Edts. J. Lissner and M. Feiderer, F. Enke Verlag, Stuttgart, 1987.
Bruker Medical Report; (1985, 1986, 1987).
Bruker Report; (vol. II, 1986; Vols. I and II, 1987; vol. I, 1988).
BIOSPEC—Series, Mr-Tomography and in Vivo Spectroscopy at High Fields.
Tomikon BMT 1100, System fur Magnetishe Resonanz-Tomographie.

Primary Examiner—Michael J. Tokar
Attorney, Agent, or Firm—Pennie & Edmonds

[57] ABSTRACT

A multi-experiment magnetic-resonance instrument such as a programmable pulse/Fourier-transform nuclear-magnetic-resonance ("NMR") spectrometer, an electron-paramagnetic-resonance spectrometer, or a magnetic resonance tomographic imaging device, capable of performing any one of a plurality of magnetic-resonance measurement sequences selected by a user and comprising: a magnet for generating a magnetic field; a probe having radio-frequency coupling circuitry positionable in the magnet; a radio-frequency generator/transmitter connected to the coupling circuitry of the probe; a radio-frequency receiver/digitizer connected to the coupling circuitry of the probe; a digitized-signal averager/processor connected to the receiver/digitizer; a programmable instrument controller having measurement-sequence control-program storage; a barcode reader connected to the instrument controller; and at least one measurement-sequence-selection barcode table having a plurality of barcode-encoded measurement-sequence data words arranged on it.

10 Claims, 2 Drawing Sheets

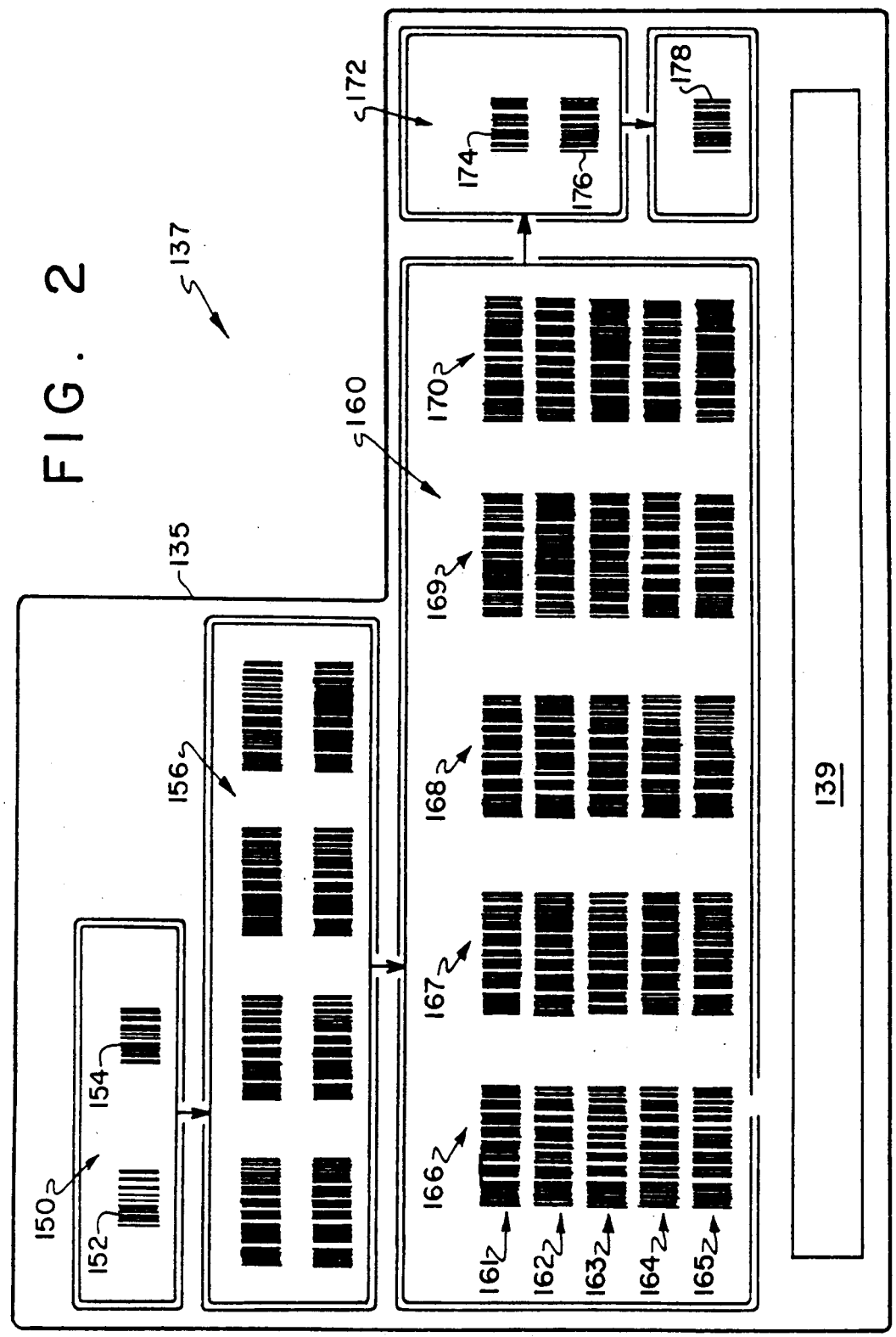

MAGNETIC-RESONANCE INSTRUMENT EMPLOYING BARCODE EXPERIMENT SPECIFICATION

FIELD OF THE INVENTION

The present invention concerns a multi-experiment magnetic-resonance instrument—such as a programmable pulse/Fourier-transform nuclear-magnetic-resonance ("NMR") spectrometer—capable of performing any one of a plurality of magnetic-resonance measurement sequences selected by a user. As used herein, the term "magnetic-resonance instrument" includes, for example, NMR spectrometers, electron-paramagnetic-resonance spectrometers, or magnetic-resonance tomographic imaging devices.

BACKGROUND ART

Conventional pulse/Fourier-transform NMR spectrometers are generally capable of performing a wide variety of magnetic-resonance measurement sequences. Such magnetic-resonance measurement sequences typically involve subjecting a sample in a magnetic field to pulsed or otherwise time-varying radio-frequency fields at one or more frequencies; amplifying, detecting, and digitizing the magnetic-resonance signals elicited from the sample by the radio-frequency fields; and processing the resulting digitized signals by Fourier transformation or other data processing operations for analysis and display. As used herein, the term "magnetic-resonance measurement sequence" can refer to sequences in which two or more operations in a magnetic resonance experiment which are carried out simultaneously—such as, for example, simultaneous irradiation of a sample at two frequencies—as well as operations which follow one another in time.

A conventional pulse/Fourier-transform NMR spectrometer ordinarily includes a radio-frequency pulse-generator/transmitter and a pulse programmer for controlling the pulse-generator/transmitter to produce sequences of radio-frequency excitation pulses. In general, each pulse in such a pulse sequence has a well-defined shape, intensity, duration, phase, and separation from neighboring pulses. Different pulse sequences are generally required for different magnetic-resonance measurement sequences.

A magnetic-resonance measurement sequence also typically involves digitizing at timed intervals the magnetic-resonance signals excited by the sequence of radio-frequency pulses, accumulating digitized signals from a number of measurement runs for signal averaging, and digitally manipulating the accumulated digitized signals by Fourier transformation or other algorithm. For this reason, conventional pulse/Fourier-transform NMR spectrometers generally include a data processor which may be programmed to perform specified data-processing operations to analyze the magnetic-resonance signals excited by a particular pulse sequence.

Among the factors which can influence the selection of a particular pulse sequence and a particular set of data processing operations is the nature of the sample to be investigated. Thus, each time a new sample is introduced into the NMR spectrometer for analysis, it is ordinarily necessary for a user to enter instructions into the spectrometer specifying the measurement sequence to be used. NMR spectrometers configured for automatic operation may include an automatic sample changer for inserting a series of samples one-by-one into and withdrawing them from the spectrometer automatically. The user must ordinarily enter instructions into the spectrometer to program the operation of the automatic sample changer as well as to specify the measurement sequence to be used for each of the samples.

Modern pulse/Fourier-transform NMR spectrometers are capable of performing an almost bewildering variety and number of measurement sequences when account is taken of the many different NMR measurement experiments which can be performed and the many different nuclei and combinations of nuclei on which such experiments can be carried out. The measurement sequences to obtain the NMR spectra of different nuclei constitute different sequences since a user must specify the identity of the nucleus—or equivalently, its resonance frequency—to the spectrometer. Moreover, the number of such measurement sequences is increased inasmuch as the NMR spectra of the various nuclei can be obtained with or without the application of radio-frequency decoupling fields for effectively eliminating interactions with other types of nuclei in the sample. The number of measurement sequences for obtaining NMR spectra is further increased in that additional radio-frequency fields may be applied to suppress interfering resonance lines from solvents in which the sample is dissolved. Different measurement sequences are required to determine relaxation times of individual resonance lines using sequences of pairs of radio-frequency pulses of differing widths—for example, a 180° pulse followed by a 90° pulse—and incrementally varying the time interval between the pulses of the pair. In still other measurement sequences of which many modern pulse/Fourier spectrometers are capable, two-dimensional spectra may be obtained which reveal interactions between different nuclei in a sample. Polarization may be transferred from one group of nuclei to another by measurement sequences such as an experiment referred to as the distortionless enhancement by polarization-transfer experiment—also referred to as the "DEPT" experiment. In general, a user must specify which of these and many other measurement sequences the pulse/Fourier-transform spectrometer is to perform on a sample in a given experiment.

In addition, conventional pulse/Fourier-transform NMR spectrometers are capable of locking the magnetic field of the spectrometer to resonance signals of a variety of nuclei in a locking channel. Optimizing the locking typically involves adjusting parameters such as the power of a radio-frequency field in the locking channel of the spectrometer, the gain of a receiver in the locking channel and the phase of a magnetic-resonance signal used for locking. A user must ordinarily specify at least the nucleus and compound from which the locking signals are to be obtained, and, in many spectrometers, may specify the values of the locking-channel parameters as well.

To produce a highly homogeneous magnetic field typically required in magnetic resonance spectroscopy, currents through various magnetic-shim coils must be adjusted. Modern high-resolution magnetic-resonance spectrometers in general perform such field shimming adjustments automatically. However, different samples and different experimental procedures may require different strategies for optimizing the shimming. Consequently, the user may have to specify the shimming procedure to be used in a given experiment.

A user is faced with additional parameters to specify which relate to collecting magnetic-resonance signal data in specifying a measurement sequence for a conventional pulse/Fourier-transform NMR spectrometer. For example, the phase, the gain, and the bandwidth of a receiver channel of the spectrometer must be specified for each measurement sequence. In addition, the interval between the times the signal is sampled must be specified.

The user of a pulse/Fourier-transform NMR spectrometer must provide further specifications in connection with processing the digitized magnetic-resonance signals for the display and analysis. For example, the user typically must specify selections for the measurement sequence in connection with correcting phase errors, compensating for base-line drift, and defining regions for integrating line intensities. In addition, the media on which the resulting spectra are to be displayed must be specified, along with scaling parameters and whether or not spectral lines will be identified digitally.

Largely as a result of the great number of different items which a user must specify in performing even routine magnetic-resonance measurements on a modern pulse/Fourier-transform NMR spectrometer, such spectrometers tend to be intimidating to users who may desire the results of magnetic-resonance measurements, but who are not experts in magnetic-resonance measurement technology.

Attempts have been made in the past to simplify the operation of NMR spectrometers so that magnetic-resonance measurements could be carried out by persons who are not expert in magnetic-resonance measurement technology. In certain cases such attempts have simplified spectrometer operations somewhat, but there remains room for improvement.

For example, a series of pulse/Fourier-transform NMR spectrometers commercially available from Bruker Instruments Inc. of Billerica, Massachusetts under the trade designation "AM"-series spectrometers has been capable of performing a variety of magnetic-resonance measurements on a number of different nuclei. Each "AM"-series spectrometer has included a computer for controlling the spectrometer as well as for storing and processing the signals obtained from the magnetic-resonance experiments. Software has been available for the computer which, on the one hand, has allowed a specialist in magnetic-resonance measurement technology to have access to the full range of the capabilities of the spectrometer, and which, on the other hand, has permitted less-experienced users to perform routine experiments without requiring them to specify the details of spectrometer operation. A menu of descriptive information has been provided which was invoked by typing a "HELP" command on the keyboard. A menu-driven procedure has been available for specifying experiments for obtaining routine NMR spectra—including certain two-dimensional spectra which directed the user to supply necessary spectrometer-control instructions through a dialogue procedure. The selected spectrometer-control instructions served to invoke control routines in the computer for controlling the operation of the spectrometer. Appropriate sets of parameters were retrieved from a magnetic disk for performing the specified experiment.

For entering spectrometer-control instructions from a user, the "AM"-series of NMR spectrometers have heretofore included a terminal in form of a console having a keyboard, a display and an interface/control system. The display of the terminal was capable of displaying the menu of instructions from which the user could select by typing on the keyboard and displaying the instructions so selected. However, the typing of a series of spectrometer-control instructions tended to be an exacting task which too often led to errors. Although certain typing errors could be detected and rejected by the terminal interface/control system when they were recognizable as syntax errors, correctly-typed, but inappropriate instructions could not in general be detected and tended to cause trouble since such instructions could launch the spectrometer on sequences of inappropriate operations.

A mouse for controlling the position of a cursor on the display has also been available for spectrometer-control instruction input in the "AM"-series of spectrometers. Another conventional pulse Fourier-transform spectrometer has employed a light pen and a CRT for entering spectrometer-control instructions. A conventional magnetic-resonance tomographic imaging device heretofore available has used a touch-sensitive CRT for entering instructions for controlling the device.

The computer software for the "AM"-series of NMR spectrometers also includes a password system which is intended to prevent one user from accessing or destroying the files of another user. In addition, the software password system is programmed to prevent users other than a designated system manager from altering the system software and the basic interface between the software and the spectrometer. However, if an unauthorized person learns the password of the system manager, the person can be in a position to make changes to the fundamental system software and software/spectrometer interface without the system manager's knowledge. Moreover, even an inexperienced user using his or her own password is permitted to bypass the menu-driven procedure for routine experiments and directly alter spectrometer settings and experimental parameters. A subsequent user can experience error, confusion, and delay when a prior user changes spectrometer settings and experimental parameters to nonstandard values and does not return them to expected standard values prior to leaving the spectrometer for the subsequent user.

Among the features heretofore available on the Bruker "AM"-series NMR spectrometer was an automated sample changer. The sample changer had an array of sample holders for holding sample tubes containing samples to be analyzed. The sample tubes were labelled with barcoded labels. The sample changer included a barcode reader mounted on the changer which was capable of reading the labels of the sample tubes one at a time. The sample changer was adapted to transfer selectively a sample tube identified by a predetermined label to the magnet.

European published patent application No. 86302595.3, published Oct. 15, 1986 under publication No. 0197791, disclosed an automated apparatus for presenting samples to an NMR spectrometer. The apparatus employed a reflective coding label affixed to a sample carrier for identifying the sample and prescribing the operating parameters of the spectrometer. An LED light source and a photodiode optical detector were mounted in the probe of the spectrometer adjacent to a sample-carrier-receptacle cavity for reading the reflective coding labels of sample carriers inserted in the cavity. Evidently, to make any change in the operating parameters prescribed by a reflective coding label for a sample required the preparation of a new reflective coding label, removing the label previously affixed to the sample carrier, and affixing the new label in place of the previous label, a major inconvenience.

SUMMARY OF THE INVENTION

We have invented a magnetic-resonance instrument which provides for convenient input of measurement-sequence specification information in which the danger of input errors is substantially reduced and which avoids problems of the prior art noted above.

Broadly, the magnetic-resonance instrument of the invention comprises a magnet for generating a magnetic field and a probe positionable in the magnet for positioning test matter to be analyzed in the magnetic field. Such test matter could include, for example, a sample of a chemical compound whose NMR spectrum is desired or a body to be imaged tomographically. The probe includes radio-frequency coupling circuitry for coupling radio-frequency signals between the test matter and the coupling circuitry. In the case of an NMR spectrometer, the coupling circuitry may comprise, for example, a solenoidal sample coil. In the case of a magnetic-resonance tomographic imaging device, the coupling circuitry may comprise, for example, a probe-head resonator circuit.

The magnetic-resonance instrument of the invention further comprises a radio-frequency generator/transmitter connected to the coupling circuitry of the probe. The generator/transmitter is capable of generating and amplifying radio-frequency excitation signals for exciting magnetic-resonance signals from the test matter in the probe in accordance with a magnetic-resonance measurement sequence. The timing of the excitation signals is specified by control signals applied to the generator/transmitter.

The magnetic-resonance instrument of the invention further comprises a radio-frequency receiver/digitizer connected to the coupling circuitry of the probe for amplifying and detecting magnetic-resonance signals from the test matter and for digitizing the signals to form digitized magnetic-resonance signals.

The magnetic-resonance instrument of the invention further includes a digitized-signal averager/processor which is connected to the receiver/digitizer. The averager/processor is capable of accumulating and storing digitized magnetic-resonance signals from the receiver/digitizer and digitally processing the stored signals for interpretation and display. Processing operations carried out by the averager/processor are specified by control signals applied to the averager/processor.

The magnetic-resonance instrument of the invention further comprises a programmable instrument controller having measurement-sequence control-program storage for storing a plurality of measurement-sequence control programs. Each measurement-sequence control program specifies one of a plurality magnetic-resonance measurement sequences which the magnetic-resonance instrument is capable of carrying out. As used herein, the term "measurement-sequence control program" can refer to any program, routine, subprogram or subroutine, or to any collection of programs, routines, subprograms, or subroutines—and to any associated data— which performs an instrument control function for a magnetic-resonance measurement sequence. Associated with each measurement-sequence control program is a digital control-program identifier for identifying the control program. The instrument controller is adapted to recall and execute selectively a measurement-sequence control program identified by a specified control-program identifier to generate control signals for the magnetic-resonance measurement sequence specified by the control program. The instrument controller is connected to the radio-frequency generator/transmitter for applying control signals to the generator/transmitter to specify the timing of the radio-frequency excitation signals generated by the generator/transmitter. The instrument controller is also connected to the digitized-signal averager/processor for applying control signals to the averager/processor to specify processing operations carried out by the averager/processor.

The magnetic-resonance instrument of the invention also includes a barcode reader which is connected to the instrument controller for reading barcode-encoded data words and transmitting signals representative of such data words to the instrument controller. A plurality of barcode-encoded data words define measurement-sequence data words. For each of a plurality of magnetic-resonance measurement sequences which the magnetic-resonance instrument is capable of carrying out, one or more barcode-encoded measurement-sequence data words constitute measurement-sequence specification information sufficient to specify the measurement sequence at least to an extent of permitting the control-program identifier associated with a measurement-sequence control program which specifies the measurement sequence to be identified. The instrument controller is adapted to receive signals from the barcode reader representative of the one or more barcode-encoded measurement data words which constitute measurement-sequence specification information specifying a measurement sequence and to recall and execute the measurement-sequence control program identified by the control-program identifier identified in the measurement-sequence specification information.

Finally, the magnetic-resonance instrument of the invention includes one or more measurement-sequence-selection barcode tables. Each measurement-sequence-selection barcode table has a plurality of barcode-encoded measurement-sequence data words arranged on it. Each barcode-encoded measurement-sequence data word on the barcode table is selectively readable by a user with the barcode reader to transmit signals to the instrument controller representative of the measurement-sequence data word. The measurement-sequence-selection barcode table has a plurality of measurement sequences associated with it which the magnetic-resonance instrument is capable of carrying out. Each of the measurement sequences associated with the barcode table can be specified by magnetic-sequence specification information constituted by one or more of the barcode-encoded measurement-sequence data words included on the barcode table. A user can thus cause the magnetic-resonance instrument to selectively perform a magnetic-resonance measurement sequence specified by one of the measurement-sequence control programs associated with a measurement-sequence-selection barcode table by reading a corresponding one or more of the barcode-encoded measurement-sequence data words on the measurement-sequence-selection barcode table with the barcode reader.

Preferably, the barcode reader of the magnetic resonance instrument of the invention is a hand-holdable wand. The barcode-reader wand is preferably connected to the instrument controller of the magnetic-resonance instrument by means of a flexible signal-transmission cable for transmitting signals encoding data representative of barcode-encoded data words read with the wand to the instrument controller. A suitable hand-holdable barcode-reader wand is commercially available under the trade designation "HBCS-2300" from the Hewlett-Packard Company of Palo Alto, Calif. In a preferred embodiment, the magnetic-resonance instrument of the invention includes a console having a control panel and the measurement-sequence-selection barcode table is removably attachable to the control panel. The preferred hand-holdable barcode-reader wand is attached to the console by the signal-transmission cable. Alternatively, a fixed-position barcode reader may be installed in a console of a magnetic-resonance instrument of the invention and a barcode table may be read by positioning the table over the reader.

The barcode reader of the magnetic-resonance instrument of the invention permits the task of entering measurement-sequence specification information into the instrument to be carried out simply, since the task involves only the reading of barcode-encoded data words constituting the specification information by means of the barcode reader. Because of the simplicity by which the measurement-sequence specification information may be entered, the input of the information tends to be free of errors.

The barcode-encoded data words on the measurement-sequence-selection barcode table are preferably labelled to indicate the instructions or data to which the data words correspond. In preferred embodiments of the invention, barcode-encoded data words appropriate to a single type of measurement sequence are grouped together on a single measurement-sequence-selection barcode table. In this way, any danger of a user's intermixing instructions or data appropriate to different types of measurement sequences is reduced. Moreover, the measurement-sequence-selection barcode table preferably includes arrows or other notations indicating the sequence in which the measurement-sequence data words on the barcode table are to be entered.

The measurement-sequence-selection barcode table of the invention is preferably in the form of a paper, cardboard or plastic sheet on which the barcode-encoded data words and associated labels are printed. Preferably, the magnetic-resonance instrument of the invention includes a plotter or other hard-copy display-output device for producing plots or other hard-copy display images of magnetic-resonance data. The instrument controller of the magnetic-resonance instrument is preferably programmed to produce measurement-sequence-selection barcode tables on the plotter or other hard-copy display output device of the instrument. Measurement-sequence-selection barcode tables can be readily reproduced on a photocopy machine.

If desired, several measurement-sequence-selection barcode tables can be bound together to form a booklet. It can be advantageous at certain magnetic-resonance instrument installations to prepare a booklet of measurement-sequence-selection barcode tables tailored for each user of the instrument. The booklet for a particular user would include barcode tables for those magnetic-resonance measurement sequences which the user was qualified or authorized to carry out. For example, a beginning user might not be authorized to perform certain measurement sequences to generate two-dimensional NMR spectra which might require hours of instrument time to complete. In addition, the measurement-sequence control programs specified in the measurement-sequence-selection barcode tables for less experienced users can employ standard values automatically for more of the required parameters, whereas corresponding measurement-sequence control programs specified in the barcode tables for more experienced users can leave it to each user to specify the values for the parameters which he or she deems best for the particular circumstances.

Preferred magnetic-resonance instruments of the invention include a display such as a CRT monitor connected to the instrument controller for displaying messages to the user. Preferably, the instrument controller is programmed to display a message confirming the measurement-sequence data word previously entered from the measurement-sequence-selection barcode table and indicating from which group on the barcode table the next data word is to be read.

In a preferred magnetic-resonance instrument of the invention in the form of a pulse/Fourier-transform spectrometer, an instrument controller embodied as a spectrometer controller includes a computer for exercising control of the functions of the spectrometer by executing spectrometer control programs, including measurement-sequence control programs. Each measurement-sequence control program when it is run specifies a particular NMR measurement sequence, including the sequence of steps to be carried out to excite the NMR signals; to detect, digitize and store the resulting signals; and to process and display the stored data. Measurement-sequence control programs and other spectrometer-control programs can be entered into the computer of the spectrometer controller from a keyboard of a terminal of the spectrometer.

The entry of spectrometer-control programs into the computer of a spectrometer controller of an NMR spectrometer of the invention is preferably restricted to a limited number of persons designated spectrometer managers who are accorded a privileged level of access to the software of the spectrometer controller. The spectrometer managers are identified by a confidential identification code which is encoded in barcode and printed on a card—preferably of pocket size—issued to each spectrometer manager. The barcode-encoded identification code on the card must be read by the barcode reader of the spectrometer and verified by the computer of the spectrometer controller before entry or fundamental alteration of a spectrometer-control program is permitted by the controller. Even after the spectrometer manager has been identified by the barcode-encoded identification code, additional passwords are preferably required to be entered by the manager before a spectrometer control program may be entered or fundamentally altered.

If a card bearing the barcode-encoded identification code of a spectrometer manager were lost or stolen, the spectrometer manager would learn that the card was missing at least by the time he or she attempted to use the spectrometer. In that event the spectrometer manager could initiate cancellation of the identification code printed on the missing card, thereby denying a holder of the lost or stolen card the privileged level of access to the software of the spectrometer controller to which the spectrometer manager was entitled.

In addition, the spectrometer of the invention preferably includes an entry-mode switch at a restricted location within the cabinet of the spectrometer to enable the spectrometer to be set in a spectrometer-control-program entry mode by a service technician or the like who has access to the interior of the cabinet.

For a preferred high-resolution pulse/Fourier-transform NMR spectrometer of the invention, two classes of measurement-sequence specification information are provided by each measurement-sequence control program as the program is run: (I) magnetic-resonance signal excitation and acquisition information, and (II) acquired magnetic-resonance-data processing and output information.

Among the items of magnetic-resonance signal excitation and acquisition information provided for such a spectrometer by preferred measurement-sequence control programs as the programs are run are: (1) the center frequency of a measurement channel, e.g. the approximate magnetic-resonance frequency of protons, carbon-13, or other types of nuclei in the magnetic field of the magnet of the spectrometer, (2) the frequency of the locking channel, e.g. the particular frequency of the proton, deuterium or other nuclear magnetic resonance line from the particular chemical compound used for locking the magnetic field, (3) the width, the intensity, the phase, and the spacing of the radio-frequency pulses applied to the sample from the measurement channel in each measurement run, e.g. the pulse sequence of the experiment, (4) a flag specifying whether or not a radio-frequency decoupling signal is to the applied to the sample from a decoupling channel, and, if so, the frequency, the power level, and the timing of the decoupling signal, (5) the number of digitized data points to be collected in each measurement run, (6) the time interval between data points, (7) a delay interval between measurement runs, and (8) a flag specifying a termination criterion for the number of measurement runs, e.g. a minimum-signal-to-noise criterion or a fixed-number-of-runs criterion, for which latter criterion the number of runs is also specified. Of the items of excitation and acquisition information listed, the spectrometer of the invention preferably permits the following to be selected by a user reading appropriate barcode-encoded data words from a measurement-sequence-selection barcode table using the barcode reader of the spectrometer: (1) the nucleus to be examined, which determines a center frequency for the measurement channel; (2) the chemical compound used for locking, which determines the frequency of the locking channel; (3) the pulse sequence of the experiment, which identifies the measurement-sequence control program to be executed, which program in turn taking into account the nucleus selected by the user specifies appropriate standard widths, phases, intensities, and spacings for the radio-frequency pulses in the measurement channel, appropriate standard timing for the decoupling signal (if any), an appropriate number of data points, an appropriate spacing between data points, an appropriate delay interval between measurement runs, and a suitable termination criterion for the number of measurement runs; and (4) whether or not a second nucleus is to be decoupled, and, if so, the identity of the second nucleus, which determines whether or not a decoupling signal will be applied, its frequency and an appropriate power level.

Among the items of acquired magnetic-resonance-data processing and output information provided for such a spectrometer by preferred measurement-sequence control programs as the programs are run are: (1) specification of window-function parameters for digital filtering, (2) a flag specifying whether or not resonance peaks are to be integrated, and, if so, specification of the spectral range over which the integration is to be carried out, (3) a flag specifying whether or not to carry out automatic base-line correction, (4) a pointer specifying the media for display or storage of spectral data, and, as appropriate, specification of display parameters, e.g. the pointer may specify that an NMR spectrum be displayed on the CRT monitor of the spectrometer or plotted on the spectrometer plotter with specified scaling, and (5) a flag specifying whether or not spectral peak positions and intensities are to be printed, and, if so, specification of a cut-off intensity value for peak identification. Of the items of acquired data processing and output information listed, the spectrometer of the invention preferably permits the following to be selected by a user reading appropriate barcode-encoded data words from a measurement-sequence-selection barcode table using the barcode reader of the spectrometer: (2) whether or not to integrate resonance peaks, (3) whether or not to carry out automatic base-line correction, (4) selection of display or storage media, and (5) whether or not to print spectral peak positions and intensities. For routine measurement sequences, standard numerical values appropriate for the choices specified by the user are preferably provided automatically by the measurement-sequence control program. Alternatively, the spectrometer-control program can unlock the keyboard of the spectrometer to enable numerical values to be entered by the user.

Another item of measurement-sequence-specification information which can be provided for a pulse/Fourier-transform NMR spectrometer of the invention by a preferred measurement-sequence control program is specification of whether or not the temperature in the probe is to be controlled, and, if so, a desired temperature value. A user may specify that the temperature in the probe is to be controlled by reading a barcode-encoded data word from a measurement-sequence-selection barcode table of the invention. The desired temperature could be entered by way of the keyboard of the spectrometer in the case the spectrometer had a temperature controller, for the probe which was computer controlled, or by way of controls on the temperature controller in the case the spectrometer had a manually-settable temperature controller.

Further items of measurement-sequence specification information which can be provided for a pulse/Fourier-transform NMR spectrometer of the invention by a preferred measurement-sequence control program include identification of replaceable parts used in the spectrometer, e.g. probes of various frequencies and bore sizes. Preferably, such replaceable parts are labelled with a label bearing a barcode-encoded part-identification code which may be read by the barcode reader of the spectrometer to identify the part.

Preferably, the measurement-selection barcode tables of the invention include barcode-encoded data words which control the progress of the measurement sequences carried out on the magnetic-resonance instrument. For example, barcode-encoded data words are preferably included on the barcode table initiating entry of the measurement-sequence-specification information, instructing the spectrometer to eject any previous sample in the probe, instructing the spectrometer to insert a new sample into the probe, and initiating the measurement sequence itself. The measurement-sequence-selection barcode table preferably includes additional data words to provide for affirmative and negative replies to questions presented on the CRT monitor of the spectrometer. Such questions may inquire as to whether or not a new measurement sequence is to be carried out on the sample presently in the spectrometer, or whether or not a new sample is to be inserted in place of the present sample.

Each measurement-sequence control program is preferably identified by a unique program identifier assigned by the spectrometer manager or other programmer who created the program. Reading one or more barcode-encoded data words from a measurement-sequence-selection barcode table to enter user-specified measurement-sequence specification information preferably causes a master control program running in the spectrometer controller to identify a measurement-sequence control program for the specified measurement sequence, to incorporate in the program a set of excitation and acquisition parameters and acquired-data processing and output parameters either directly specified by the barcode-encoded data words entered by the user or automatically selected taking into account the data words entered by the user, and to execute the program.

A magnetic-resonance instrument of the invention in the form of a magnetic-resonance tomographic imaging device preferably has an instrument controller which is programmed to permit only persons who enter a valid barcode-encoded identification code via the barcode reader of the device to operate the device. Each qualified operator of the tomographic imaging device is preferably issued a card—preferably of pocket size— bearing such a barcode-encoded identification code which identifies the operator. Access to a magnet room in which the magnet of the tomographic imaging device is located is preferably controlled by the instrument controller of the device by means of a remote-controlled lock on each door to the magnet room. In this way access to the magnet room can be limited to persons who enter a valid barcode-encoded identification code into the instrument-controller of the magnetic-resonance tomographic imaging device. A magnet-room-access auxiliary barcode reader located close to a door to the magnet room and connected to the instrument controller may facilitate the reading of the identification codes of persons who wish to enter the magnet room.

Preferably, each patient examined by the magnetic-resonance tomographic imaging device of the invention is assigned a unique barcode-encoded patient-identification code. The doctor in charge of the tomographic-imaging examination is also preferably assigned a unique barcode-encoded doctor-identification code. Both the patient identification code and the doctor-identification code in barcoded form are preferably taken with the patient to the magnet room and read immediately prior to the examination to confirm the identity of the patient. For this purpose, the barcode-encoded patient identification code of the patient and the doctor-identification code of his or her doctor is preferably printed on a nonmagnetic wristband worn by the patient during the examination. The instrument controller for the magnetic-resonance imaging device is preferably programmed not to allow the examination to proceed until the identity of the patient is established by reading of the barcode-encoded patient and doctor-identification codes. Preferably, a magnet-room auxiliary barcode reader connected to the instrument controller is located in the magnet room and may be used to read the barcode-encoded patient and doctor identification codes of the patient. The patient and doctor identification codes are preferably printed on each tomographic image taken of the patient for purposes of identification, as well as on any printout of data pertaining to the examination produced by the tomographic imaging device.

Preferably, the magnetic-resonance tomographic imaging device of the invention permits an operator to specify the following items of measurement-sequence specification information by reading selected barcode-encoded measurement-sequence data words from one or more measurement-sequence-selection barcode tables using the barcode reader of the device: (1) the body part to be imaged, e.g. head, torso, leg; (2) the type of image, which determines the tomographic-imaging pulse and magnetic-gradient sequence to be applied; (3) the number and spacing of the slices to be imaged; (4) a flag specifying whether or not to activate automatic radio-frequency tuning; (5) a flag specifying whether or not to activate automatic magnetic-field shimming; and (6) identification of replaceable parts employed in the tomographic imaging device, e.g. replaceable probe coupling circuits such as surface coils of various conformations and bird-cage resonators of various forms and capacities. In connection with the identification of replaceable parts employed in the device, it is preferred that each such replaceable part be labelled with a barcode-encoded part-identification code. The presence of the part in the tomographic imaging device could then be verified by reading the part-identification code of the part in the device with the magnet-room auxiliary barcode reader. The instrument controller of the device is preferably programmed not to permit the examination to proceed until the identity of the replaceable parts is confirmed by reading the part-identification codes labelling such parts in the device. The instrument controller can verify that each of the replaceable parts present in the device has an adequate power rating and is otherwise suitable for the tomographic imaging measurement sequence specified.

In addition, the progress of a tomographic examination is preferably controlled in a magnetic-resonance tomographic imaging device of the invention by reading of barcode-encoded data words from a measurement-sequence-selection barcode table. Barcode-encoded data words selected by an operator could cause the device to advance to the next step of the measurement sequence, hold the present state of the device to the extent that it is safe to do so, escape from barcode control, and abort the imaging process.

Preferred magnetic-resonance instruments of the invention are flexible in that new measurement-sequence control programs may be written to specify new magnetic-resonance measurement sequences which users desire to run on the instrument. Each such new measurement-sequence control program can be assigned a control-program identifier which is identified by measurement-sequence specification information from one or more barcode-encoded measurement-sequence data words. Thereafter, users can carry out the new measurement sequence by entering the appropriate barcode-encoded measurement-sequence data word or words by way of the barcode reader of the instrument.

Advantageously, preferred magnetic-resonance instruments of the invention may be operated by persons who have no knowledge of the software needed to control the instrument. The specification of measurement sequences can proceed quickly. For example, only four barcode-encoded data words need to be entered to select and begin a routine NMR measurement sequence in one preferred pulse/Fourier-transform spectrometer of the invention.

BRIEF DESCRIPTION OF THE DRAWINGS

The foregoing and other objects, features, and advantages of the invention will become apparent from the following more particular description of a preferred embodiment thereof, as illustrated in the accompanying drawings.

FIG. 2 illustrates a preferred measurement-sequence-selection barcode table.

BEST MODE FOR CARRYING OUT THE INVENTION

Figure 1:
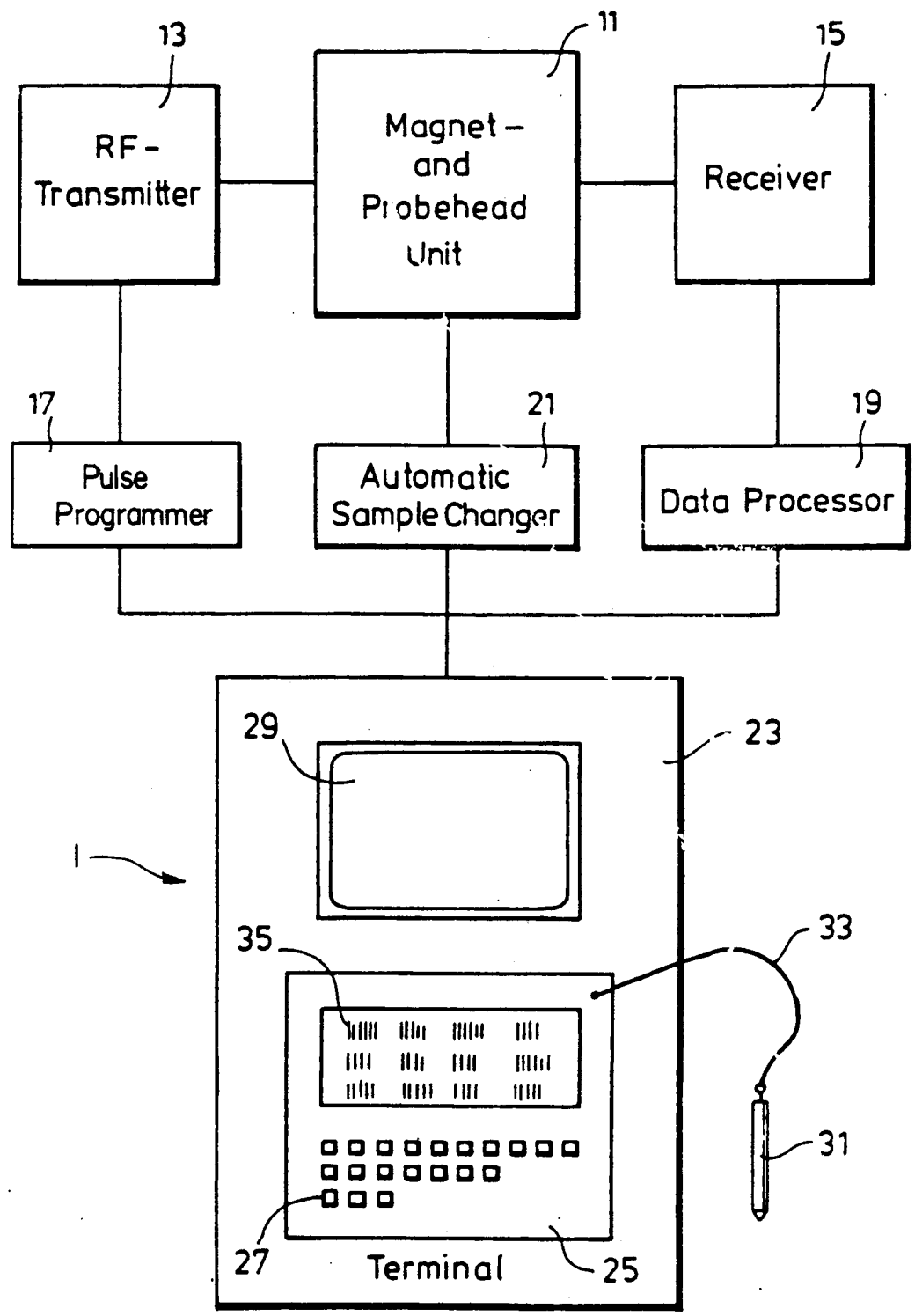
FIG. 1 shows a schematic block-diagram of a preferred NMR spectrometer of the invention.

Turning now to FIG. 1, an NMR spectrometer 1 comprises a magnet system providing an essentially homogeneous magnetic field in which a probe head is positioned. The magnetic system and the probe head are identified collectively in FIG. 1 as magnet and probe head unit 11. A radio-frequency transmitter 13 and a receiver 15 are connected to the probe head of unit 11.

A pulse programmer 17 is connected to the radio-frequency transmitter 13 in order to control the sequences of radio-frequency pulses produced by the transmitter 13 and applied to the probe head. A data processor 19 is connected to an output of the receiver 15. The data processor 19 is capable of accumulating and storing magnetic-resonance signals detected and digitized by the receiver 15 and digitally processing the stored digitized signals for analysis and display.

An automatic sample changer 21 is connected to the probe head in the magnet and probe head unit 11. The automatic sample changer 21 is adapted to store up to about 120 NMR sample tubes in a generally circular sample-holder carousel and to rotate the carousel stepwise to position a selected sample tube in the carousel at a sample-tube take-off/return position. The automatic sample changer is further adapted to withdraw a sample tube located at the take-off/return position, then to insert the sample tube into the probe head for measurement, and, after the measurement is completed, to remove the sample tube from the probe head and replace it in the sample-holder carousel of the sample changer at the take-off/return position. Each sample tube can have a generally-cylindrical label collar mounted axially on it to which an adhesive label may be affixed. A barcode-encoded sample-identification code can be printed on the label to identify the sample. The automatic sample changer 21 includes a sample-tube-label barcode reader mounted in a position to read barcode-encoded sample-identification codes on the sample tubes having collars with labels bearing such codes.

The pulse programmer 17, the data processor 19, the automatic sample changer 21, and the sample-tube-label barcode reader are connected to a spectrometer controller housed in a terminal 23. The spectrometer controller includes a digital computer having read/write storage and a magnetic-disk storage unit for storing spectrometer control programs for controlling the pulse programmer 17, the data processor 19 and the automatic sample changer 21. The terminal 23 comprises a keyboard 27 and a CRT monitor 29 for data display. A hand-holdable barcode-reader wand 31 is connected to the terminal 23 by a flexible signal-transmission cable 33. Positioned adjacent to the keyboard 27 is a control panel 25 on which a measurement-sequence-selection barcode table 35 is removably mounted. FIG. 2 illustrates in greater detail a preferred measurement-sequence-selection barcode table 135 for a manual operating mode of the spectrometer.

Turning now to FIG. 2, the measurement-sequence-selection barcode table 135 is a cardboard sheet having a corner cutout 137 and a keyrow cutout 139. The keyrow cutout 139 is dimensioned so that a top row of keys of the keyboard 27 fits through the cutout to hold the barcode table in place. The corner cutout 137 provides clearance for certain indicator lights (not shown) mounted in the control panel 25 of the terminal 23 to be seen with the barcode table 135 in place.

The measurement-sequence-selection barcode table 135 has 38 barcode-encoded data Words printed on an upper surface of the table. The 38 barcode-encoded data words are arranged in five groups. An experiment-initiation group 150 includes a first data word 152 labelled "Start Experiment" and a second data word 154 labelled "Insert Sample." A user-identification group 156 includes eight barcode-encoded data words labelled "User 1" through "User 8," respectively. Positioned below the user-identification group 156 of data words is an experiment/solvent group 160 of 25 barcode-encoded data words arranged in a five-by-five array. The five rows of the array are labelled with the following five solvents which are commonly used to dissolve samples in high-resolution NMR experiments and which have resonance lines suitable for locking the magnetic field: acetone, benzene, $CDCl_3$, $D_2O$ and DMSO. The five columns of the experiment/solvent group 160 are labelled with the following five labels: "$^1H$," "$^1H$ S/N ABORT," "$^{13}C$," "$^{13}C$ S/N ABORT," and "$^{13}C$ Multiplicity Analysis." To the right of the experiment/solvent 160 of data words is a Yes/No group 172 of data words, consisting of a data word 174 labelled "Yes" and a data word 176 labelled "No." Finally, an inject group containing a single barcode-encoded data word 178 labelled "Inject" is located below the Yes/No group 172 of data words. As may be seen in FIG. 2, arrows are drawn on the barcode table 135 from the experiment-initiation group 150 to the user-identification group 156, from the user-identification group 156 to the experiment/solvent group 160, from the experiment/solvent group 160 to the Yes/No group 162, and from the Yes/No group 172 to the inject group 178.

In operation, a master control program executed by the computer of the spectrometer controller provides supervisory control of the operation of the spectrometer. The master control program controls the input of spectrometer control information into the spectrometer controller from both the keyboard 27 and the barcode reader 31. The master control program distinguishes between ordinary users and spectrometer managers. A spectrometer manager is recognized by the spectrometer controller running the master control program by an identification code unique to the manager entered by way of the barcode reader.

A spectrometer manager, once so identified, can instruct the master control program to place the spectrometer in a number of operating modes. A master-control-instruction barcode table has barcode-encoded data words printed on it which can be entered into the spectrometer controller by a spectrometer manager using the barcode-reader wand 31 to specify the various operating modes. One such operating mode is a restricted barcode-encoded information entry mode. With the spectrometer in the restricted barcode-encoded information entry mode, the keyboard 27 of the spectrometer is effectively locked and users can enter spectrometer-control information into the spectrometer controller—with limited exceptions—only by way of the barcode reader 31. Another operating mode which can be specified by a spectrometer manager is a manual-sample-insertion operating mode or an automatic-sample-changer operating mode.

In operation, with the spectrometer in the manual-sample-insertion operating mode and in the restricted barcode-encoded information entry mode, a user enters barcode-encoded data words into the spectrometer controller by gently moving the barcode-reader wand 31 over a selected data word on the measurement-sequence-selection barcode table 135. Entry of the "Start Experiment" data word 152 from the experiment-initiation group 150 on the barcode table 135 initiates the sequence of an experiment by turning on the sample-lift air jet of the probe. A message is then displayed on the CRT monitor 29 to exchange or insert a sample tube. The user inserts a sample tube in a sample-insertion port and then enters the "Insert-Sample" data word 154 of the experiment-initiation group 150 by using the barcode-reader wand 31. Entry of the "Insert-Sample" data word 154 causes the sample-lift air jet to terminate and the sample tube to settle into the probe in the magnet. A message is then displayed on the monitor 29 instructing the user to enter a user code. The user then enters one of the eight user-identification data words in the user identification group 156. The user-identification code thus selected is employed to identify all data collected in the measurement sequence.

After the user-identification code is entered, a message is displayed on the monitor instructing the user to enter an experiment/solvent combination. The user selects a desired experiment corresponding to one of five columns of the experiment/solvent group 160 on the measurement-sequence-selection barcode table 135. In addition, the user identifies which of the five solvents associated with the rows of the experiment/solvent group 160 was used as a solvent for the sample in the sample tube. If the desired experiment and solvent combination is not found on the measurement-sequence-selection barcode table 135, the user must choose another barcode table which includes the desired combination. Reading the barcode-encoded data word corresponding to the column of the desired experiment and the row of the solvent with the barcode-reader wand enters an experiment/solvent combination into the spectrometer controller. A message is then displayed on the CRT monitor 29 requesting an optional plot title. The keyboard is unlocked to permit the user to input a title if desired. The spectrometer controller then recalls and executes an appropriate measurement-sequence control program to carry out the desired measurement. All parameters required for the measurement sequence are automatically set to standard values, and data acquisition and processing is started. In particular, the measurement-sequence-control program automatically takes care of shimming the magnet, rotating the sample tube, locking the magnetic field to the specified solvent line, adjusting the receiver gain, selecting an appropriate criterion for determining the number of measurement runs, accumulating and Fourier-transforming or otherwise processing the data optimizing the spectral width in the case of two-dimensional experiments, carrying out carbon multiplicity analysis automatically should that experiment have been selected, plotting spectra with integrals and automatic expansion, and optimizing the plots of two-dimensional spectra.

When the measurement sequence is finished, the CRT monitor 29 displays a message asking whether another experiment with the same sample is desired. The user answers the question by reading with the barcode-reader wand 31 either the Yes data word 174 or the No data word 176 in the Yes/No group of data words 172. If the Yes data word 174 is selected, a message to enter a desired experiment/solvent combination is displayed on the monitor 29 and the procedure continues as explained above.

If the No data word 176 is read with the barcode reader wand 31, the monitor displays a message asking if the user wishes to perform an experiment on a different sample. The user must again respond to the question by selecting one of the Yes and No data words in the Yes/No group 172.

If the user responds by selecting the Yes barcode-encoded data word 174, the sample-lift air jet is actuated and the previous sample tube in the probe is raised to the sample-insertion port. A message is then displayed requesting that the samples be exchanged. After the user exchanges the samples by removing the previous sample tube from the sample-insertion port and replacing it with a new sample tube, the injection data word 178 is read, which causes the sample-lift air jet to be turned off and the new sample tube to settle into the probe. The CRT monitor 29 then displays a message requesting selection of an experiment/solvent combination and the procedure continues as explained above.

If the user responds by selecting the NO barcode-encoded data word 176, the sample tube in the probe is raised to the sample-insertion port with the sample-lift air jet. A message on the CRT monitor asks the user remove the sample from the sample-insertion port and to turn off the sample-lift air jet by entering the injection data word 178. The spectrometer is then free for use by others.

When the spectrometer is in the restricted barcode-encoded information entry mode and the automatic-sample-changer operating mode, a measurement-sequence-specification barcode table is used which is generally similar to the barcode table 135 illustrated in FIG. 2, but in which certain of the barcode-encoded data words and their associated labels on the table are different. When the spectrometer is placed in the automatic-sample-changer operating mode, the monitor 29 initially displays the message "User Identification." The spectrometer is free for use by ordinary users as well as spectrometer managers. A user enters one of eight barcode-encoded data words from a user-identification group of data words on the barcode table using the barcode-reader wand 31.

After entry of the user-identification code, the monitor 29 displays the message "Free for Input, Sample Identification." As noted above, the automatic sample changer 21 includes a sample-tube-label barcode reader positioned to read labels affixed to label collars mounted on sample tubes, which labels bear barcode-encoded sample-identification codes. The user enters a sample identification code by reading the barcode on the label of the sample tube using the hand-holdable barcode-reader wand 31.

After the sample identification code is read, the monitor displays the message "Experiment/Solvent." The measurement-sequence-selection barcode table for the automatic-sample-changer operating mode includes an experiment/solvent group of twenty-five barcode-encoded data words arranged in a 5×5 array generally similar to the experiment/solvent group 160 of the barcode table 135 of FIG. 2. By reading one of the barcode-encoded data words in the 5×5 array, the user specifies one of five experiments to be run on the sample and one of five solvents in which the sample is dissolved and which can provide a resonance signal for the locking channel.

After the experiment/solvent combination is selected, the RT monitor 29 of the spectrometer displays the message "Put Sample in Sample Holder, Verify by Entering Sample in Holder, Barcode." At this point, the user inserts the sample tube in the sample-holder carousel of the automatic sample changer and then reads a barcode-encoded data word on the measurement-sequence-selection barcode table which is labeled "Sample in Holder" to verify that the sample tube has been placed in the sample-holder carousel.

The spectrometer then begins automatic background measurement operation; specifically, the spectrometer begins the measurement sequence for any samples to be measured in the automatic sample changer as a background measurement operation, while essentially simultaneously permitting users to enter measurement-sequence-specification information data for additional samples as a foreground data-entry operation. The master control program of the spectrometer controller begins the automatic background measurement operation by turning on the sample-lift air jet to eject any sample tube presently located in the probe and to transfer the sample tube to the sample-holder carousel of the automatic sample changer. The sample changer then advances the sample-holder carousel one position and the barcode-encoded sample-identification code on the sample-tube label of the next sample tube in the carousel, if any, is read. If the sample-tube-label identifies the sample as one which is to be measured, the spectrometer controller causes the automatic sample changer to transfer the sample tube to the sample-insertion port and to lower the sample tube into the probe. If the sample is not one which has been previously specified to be measured, or if there is no sample in that location in the sample-holder carousel, or if the sample is one which has already been measured, the spectrometer controller causes the automatic sample changer to advance the sample-holder carousel an additional position. The barcode-encoded sample-identification code on the sample-tube label of the sample in the next position, if any, is then read and the cycle repeats.

Once a sample tube has been loaded into the probe, the spectrometer-control program specified by the experiment/solvent combination entered for the sample is carried out. The data obtained from the measurement is stored under the user identification code of the user who entered the measurement-sequence-specification information for that sample. When the measurement is completed, the sample-lift air jet is turned on, the sample ejected and the process repeated for the next sample in the sample changer.

During the automatic background measurement operation, users may identify additional new samples in the foreground by first entering a barcode-encoded user-identification code, then reading the barcode-encoded sample-identification code on the sample-tube-label of each additional sample and finally reading a barcode-encoded data word specifying an experiment/solvent combination for the sample so identified. The sample tubes containing the additional samples may be placed at random positions in the sample-holder carousel. The automatic sample changer advances the carousel stepwise and all identified samples which have not previously been measured are measured as they reach the measurement position. Samples which have previously been measured or which have not been identified to the spectrometer controller by reading of their barcode-encoded sample-identification labels and entering an associated experiment/solvent combination are ignored.

The presence of a label collar and sample-tube-label on a sample tube can occasionally introduce a slight imbalance which causes the tube to wobble slightly as it spins in the probe. In certain circumstances such wobbling can introduce small spinning sidebands which usually are no greater than background noise and can be ignored, but which occasionally represent a problem in certain NMR experiments requiring extremely high resolution. In the present preferred spectrometer of the invention, such spinning sidebands can be avoided even with the spectrometer in the automatic-sample-changer operating mode. Specifically, a user can cause the automatic sample changer to hold a sample tube which does not carry a label collar in the sample-holder carousel at the take-off/return position. The user can bypass the barcode reader of the automatic sample changer and read a barcode-encoded sample-identification code for the sample with the hand-holdable barcode reader wand of the spectrometer. The spectrometer and automatic sample changer then process the sample tube without the label collar just as if the sample-identification code had been read from a label collar with the barcode reader of the automated sample changer.

A listing of a barcode-reader interface subroutine for a master control program for a preferred pulse/Fourier-transform NMR spectrometer of the invention written in the Pascal programming language for an "Aspect 3000" digital computer is attached hereto as Appendix A and made a part of this specification.

It is not intended to limit the present invention to the specific embodiments described above. It is recognized that changes may be made in the magnetic-resonance instrument described herein without departing from the scope and teaching of the instant invention and it is intended to encompass all embodiments, alterations and modifications consistent with the invention.

APPENDIX A (BARPEN.EXE 881031 - EXE file for operation with Barcode Pen nb. Lines 1 & 3-5 in AUTOSAMA.AU must be DEACTIVATED)

```
KEYF
1ZE, DY
OUT,PP&
'SUSPEND'
PASC BARPEN
 -, -,18
DIAO,NNTYY&
BARN
&
(START OF PROGRAM LOOP)&
&
$A
'ASSIGN' 4= -
PASC BARPEN
 -, -,3
"^G" 'INPUT" 1&
'IF' 1=S 'GOTO' X
'IF' 1=#215 'GOTO' B
'GOTO' A (ENTER USER CODE)&

$B
PASC BARPEN
 ?, -,6
"^G"'INPUT' 4
'IF' 2=Y 'GOTO' C
```

'GOTO' E (Acquisition or BARPLOT?)

$C
PASC BARPEN
 -, -, 4
$J
"^G"'INPUT' 1
'IF' 1-B 'GOTO' Y
'IF' 1-#215 'GOTO' E
'GOTO' D (SAMPLE LIFT ON, INSERT SAMPLE)&

$E
1ZE,RO,NEJ
PASC BARPEN
'USE' 4, -,5
$F
"^G"' INPUT' 1&
'IF' 1-R 'GOTO' W
'IF' 1-#215 'GOTO' G
'GOTO' F
$G
IJ,RO,Y,N&
&
(ENTER EXPERIMENT/SOLVENT COMBINATION)&
&
$H
1ZE
PASC BARPEN
'USE' 4, ?,7
"
^G " 'INPUT' 5&
JOUS,'USE' 4&
KEYN

```
'ENABLE'
&
(ENTER PLOT TITLE)7
&
PASC BARPEN
'USE' 4,'USE' 5,8
"^G
Enter plot title (terminate with CR) : " "INPUT" 6&
'SUSPEND'
KEYF
DY
&
(SET UP EXPERIMENT)&
&
1SET,'USE' 4,,Y,'USE' 5,'USE' 6,,N&
'IF' 1-Y 'GOTO' J
DY
&
(SEARCH FOR LOCK IF FIRST EXPERIMENT)&
&
PASC BARPEN
'USE' 4,'USE' 5,17
AU PENLOCK.AU,'BG'
DY,OUT,PP&
"^G
Has LOCK been fond? Enter YES or NO :
(Enter "TOGGLE' to toggle lock display)"
$I
'INPUT' 1
'IF' 1-Y 'GOTO' J
'IF' 1-R DY,
'IF' 1-R 'GOTO' W
'IF' 1-T ^L
'IF' 1-N DY
'IF' 1-N 'GOTO' U
'GOTO' I (START ACQUISITION)
```

```
$J
BARF
JOUS,'USE' 4&
RUN,Y,,'USE' 4,YN&
'WAIT' 10
&
(START PROCESSING)&
&
JOUS,'USE' 4&
RUN,NY,,
'WAIT' 10
HALT,NYNN&
'IF' 3-Y 'GOTO' K          (ACQUISITION IN PROGRESS)
DY
PASC BARPEN
'USE' 4,'USE' 5,9
$K
2'BG'&
'WAIT' 10
UDIS,1
'IF' 3-Y 'GOTO' L
DY
$L
1HALT,NNNY&
'IF' 3-Y 'GOTO' M          (PROCESSING IN PROGRESS)
DY
PASC BARPEN
'USE' 4,'USE' 5,10
$M
3'BG'&
'WAIT' 10
UDIS,0
'IF' 3-Y DY,
BARN
&
(MANUAL EXPANSION PLOT?)&
&
$N
```

```
PASC BARPEN
'USE' 4,'USE' 5,11
"
^G"'INPUT' 1
'IF' 1-Y 'GOTO' O
'IF' 1-N 'GOTO' S
'IF' 1-R 'GOTO' W
PASC BARPEN
'USE' 4,'USE' 5,12
"^G"
'GOTO' N (SELECT REGION FOR EXPANSION PLOT)

$O
3DY,OUT PPEP
"^G
Use Knobs A/B, VDS Buttons to select plot region.
Enter YES when ready: (Enter TOGGLE to toggle scale)"
$P
'INPUT 1
'IF' 1-Y 'GOTO' O
'IF' 1-R DY,
'IF' 1-R 'GOTO' W
'IF' 1-T E&
'GOTO' P (DO EXPANSION PLOT OF SELECTED REGION)

$Q
U,CY,O
BARF
'IF' 3-Y 'GOTO' R
DY
PASC BARPEN
'USE' 4,'USE' 5,10
$R
AU PENPXB.AU,'BG&
```

NP
'WAIT' 10
'IF' 3=Y DY,
BARN
'GOTO' N (MORE EXPERIMENTS FOR CURRENT SAMPLE?)

$S
1PASC BARPEN
'USE' 4, -,13
"
^G " 'INPUT' 1
'IF' 1=Y 'GOTO' H
'IF' 1=N 'GOTO' U
'IF' 1=R 'GOTO' W
PASC BARPEN
'USE' 4, -,12
" ^G "'WAIT' 2
'GOTO' S (WHEN CURRENT USER IS FINISHED, EJECT SAMPLE
AND RETURN TO START)

$T
RO,NEJ
PASC BARPEN
'USE' 4, -,14
"^G " 'INPUT' 1&
'IF' 1=R 'GOTO' W
IJ
'GOTO' A (ANOTHER SAMPLE FOR SAME USER?)

$U
PASC BARPEN
'USE' 4, -,15

```
"
^G " 'INPUT' 1&
'IF' 1-Y 'GOTO' V
'IF' 1-N 'GOTO' T
'IF' 1-R 'GOTO' W
PASC BARPEN
'USE' 4, -,12
"^G" 'GOTO' U
```

(REMOVE SAMPLE WHEN CURRENT USER HAS ANOTHER SAMPLE)

```
$V
RO,NEJ
PASC BARPEN
'USE' 4, -,16
"
^G " 'INPUT' 1&
'IF' 1-R 'GOTO' W
IJ,RO,Y,N&
'GOTO' H
```

(RETURN TO START AFTER FILLING IN LOG)

```
$W
,PASC BARPEN
'USE' 4, -,25
'GOTO' A
```

(SUPERVISOR COMMANDS)

```
$X
PASC BARPEN
'USE' 4, -,26
'INPUT' 1
'IF' 1-B 'GOTO' Y
'IF' 1-C 'GOTO' g
'IF' 1-D 'GOTO' c
'IF' 1-E 'GOTO' h
'IF' 1-I 'GOTO' e
```

```
'IF' 1=L 'GOTO' b
'IF' 1=X 'GOTO' a
'IF' 1=R 'GOTO' A
'GOTO' X
(GENERATE BARCODES ON SYSTEM PLOTTER)

$Y
"
BARPLOT VERSION 880929 (OR LATER) NECESSARY!
INPUT VIA KEYBOARD"
KEYN
PASC BARPEN
"^G"&
$Z
'INPUT' 1
'USE' 1
'IF' 1<#212 'GOTO' Z
'IF' 1>#212 'GOTO' Z
KEYF
'GOTO' A (TURN KEYBOARD ON, TYPE CTRL/X TO GO TO ADAKOS REGION 2
ANY OTHER CHARACTER IN REGION 1 WILL CONTINUE EXE FILE
EXECUTION)

$a
PASC BARPEN
 -, -,20
KEYN
"^G"'INPUT' 1
KEYF
'GOTO' X
(LIST CURRENT LOG FILE ON CHANNEL A)
$b
PASC BARPEN
 -, -,21
"^G"'BG'
'GOTO' X
```

(DISPLAY CURRENT LOG FILE)

$c

PASC BARPEN

-, -,22

"^G"&

$d 'INPUT' 1

'USE' 1

'IF' 1-N 'GOTO' X

'GOTO' d (DISPLAY BARPEN.INFO)

$e

PASC BARPEN

-, -,24

"^G"&

$f

'INPUT' 1

'USE' 1

'IF' 1-N 'GOTO' X

'GOTO' f (CONFIGURE PROGRAM)

$g

PASC BARPEN

-, -,1

"^G"'INPUT' 3

PASC BARPEN

-, -,2

"^G"'INPUT' 2

'GOTO' X (EXIT PROGRAM)

```
$h
"^G"PASC BARPEN
-, -,19
'ENABLE'
KEYN
BARF
1UDSIS,1
DY,DY,DY
OUT,B
"   ^G^J"1&
```

I claim:

1. A magnetic-resonance instrument programmable to perform a plurality of magnetic-resonance measurement sequences, comprising:

(a) a magnet for generating a magnetic field;

(b) a probe having radio-frequency coupling circuitry positionable in the magnet for coupling radio-frequency signals between the coupling circuitry and test matter to be analyzed in the magnetic field;

(c) a radio-frequency generator/transmitter connected to the coupling circuitry of the probe for generating and amplifying radio-frequency excitation signals in accordance with a magnetic-resonance measurement sequence for exciting magnetic-resonance signals from the test matter in the probe, the timing of the excitation signals being specified by control signals applied to the generator/transmitter;

(d) a radio-frequency receiver/digitizer connected to the coupling circuitry of the probe for amplifying and detecting magnetic-resonance signals from the test matter and digitizing the signals to form digitized magnetic-resonance signals;

(e) a digitized-signal averager/processor connected to the receiver/digitizer for accumulating and storing digitized magnetic-resonance signals from the receiver/digitizer and digitally processing the stored signals for interpretation and display, processing operations carrier out by the averager/processor being specified by control signals applied to the averager/processor;

(f) a programmable instrument controller having measurement-sequence control-program storage for storing a plurality of measurement-sequence control programs, each measurement-sequence control program specifying one of the plurality of magnetic-resonance measurement sequences which the magnetic-resonance instrument is programmable to perform and being associated with a digital control-program identifier for identifying the measurement-sequence control program, the instrument controller being adapted to recall and execute selectively a measurement-sequence control program identified by a specified control-program identifier to generate control signals for the magnetic-resonance measurement sequence specified by the control program, the instrument controller being connected to the radio-frequency generator/transmitter for applying control signals to the generator/transmitter to specify the timing of the radio-frequency excitation signals generated by the generator/transmitter and connected to the digitized-signal averager/processor for applying control signals to the averager/processor to specify processing operation carried out by the averager/processor;

(g) a barcode reader connected to the instrument controller for reading barcode-encoded data words and transmitting signals representative of the data words to the instrument controller, a plurality of barcode-encoded data words defining measurement-sequence data words, one or more barcode-encoded data words being associated with each of the magnetic-resonance measurement sequences which the magnetic-resonance instrument is programmable to perform to constitute measurement-sequence specification information sufficient to specify the measurement sequence at least to the extent of permitting the control-program identifier associated with a measurement-sequence control program which specifies the measurement sequence to be identified, the instrument controller being adapted to receive signals from the barcode reader representative of the one or more barcode-encoded measurement sequence data words which constitute measurement-sequence specification information specifying a measurement sequence and to recall and execute the measurement-sequence control program identified by the control-program identifier identified in the measurement-sequence specification information; and (h) at least one measurement-sequence-selection barcode table having a plurality of barcode-encoded measurement-sequence data words arranged on it, each barcode-encoded measurement-sequence data word on the barcode table being selectively readable by a user with the barcode reader to transmit signals to the instrument controller representative of the measurement-sequence data word, the measurement-sequence-selection barcode table having a plurality of measurement sequences associated with it which the magnetic-resonance instrument is programmable to perform, each of the measurement sequences associated with the barcode table being specifiable by magnetic-sequence specification information constituted by one or more of the barcode-encoded measurement-sequence data words included on the barcode table, so that a user can cause the magnetic-resonance instrument to selectively perform a magnetic-resonance measurement sequence specified by one of the measurement-sequence control programs associated with the measurement-sequence selection barcode table by reading a corresponding one or more of the barcode-encoded measurement-sequence data words on the measurement-sequence-selection barcode table with the barcode reader.

2. The magnetic-resonance instrument according to claim 1 in which the barcode reader is a hand-holdable barcode-reader wand connected to the instrument controller by means of a flexible signal-transmission cable.

3. The magnetic-resonance instrument according to claim 2 in which the magnetic-resonance instrument includes a console having a control panel, the barcode-reader wand being connected to the console by the signal-transmission cable and the measurement-sequence-selection barcode table being removable mountable on the control panel at a location where the barcode-encoded measurement-sequence data words arranged on the barcode table may be read by the barcode reader wand.

4. The magnetic-resonance instrument according to claim 3 in which the coupling circuitry of the probe comprises a replaceable element, the replaceable element being labelled with a barcode-encoded part-identification code for identifying the element, the instrument controller being adapted to receive signals from a barcode reader representative of the part-identification code and to condition performance of a measurement sequence upon verification that the signals represent a replaceable element acceptable for the measurement sequence.

5. The magnetic-resonance instrument according to claim 3 in which the instrument is a pulse/Fourier-transform NMR spectrometer.

6. The magnetic-resonance instrument according to claim 3 in which the instrument is a magnetic-resonance tomographic imaging device.

7. A magnetic-resonance spectrometer programmable to perform a plurality of magnetic-resonance measurement sequences, comprising:

(a) a magnet for generating a substantially homogeneous magnetic field;

(b) a probe having radio-frequency coupling circuitry positionable in the magnet for positioning a sample to be analyzed in the magnetic field and for coupling radio-frequency signals between the sample and the coupling circuitry;

(c) a radio-frequency generator/transmitter connected to the coupling circuitry of the probe for generating and amplifying radio-frequency excitation signals in accordance with a magnetic-resonance measurement sequence for exciting magnetic-resonance signals from the sample in the probe, the timing of the excitation signals being specified by control signals applied to the generator/transmitter;

(d) a radio-frequency receiver/digitizer connected to the coupling circuitry of the probe for amplifying and detecting magnetic-resonance signals from the sample to be analyzed in the magnetic field and for coupling radio-frequency signals between the sample and the coupling circuitry;

(c) a radio-frequency generator/transmitter connected to the coupling circuitry of the probe for generating and amplifying radio-frequency excitation signals in accordance with a magnetic-resonance measurement sequence for exciting magnetic-resonance signals from the sample in the probe, the timing of the excitation signals being specified by control signals applied to the generator/transmitter;

(d) a radio-frequency receiver/digitizer connected to the coupling circuitry of the probe for amplifying and detecting magnetic-resonance signals from the sample and digitizing the signals to form digitized magnetic-resonance signals;

(e) a digitized-signal averager/processor connected to the receiver/digitizer for accumulating and storing digitized magnetic-resonance signals from the receiver/digitizer and digitally processing the stored signals for interpretation and display, processing operations carried out by the averager/processor being specified by control signals applied to the averager/processor;

(f) a programmable spectrometer controller having measurement-sequence control-program storage for storing a plurality of measurement-sequence control programs, each measurement-sequence control program specifying one of the plurality of magnetic-resonance measurement sequences which the spectrometer is programmable to perform and being associated with a digital control-program identifier for identifying the measurement-sequence control program, the spectrometer controller being adapted to recall and execute selectively a measurement-sequence control program identified by a specified control-program identifier to generate control signals for the magnetic-resonance measurement sequence specified by the control program, the spectrometer controller being connected to the radio-frequency generator/transmitter for applying control signals to the generator/transmitter to specify the timing of the radio-frequency excitation signals generated by the generator/transmitter and connected to the digitized-signal averager/processor for applying control signals to the averager/processor to specify processing operations carried out by the averager/processor;

(g) a barcode reader connected to the spectrometer controller for reading barcode-encoded data words and transmitting signals representative of the data words to the spectrometer controller, a plurality of barcode-encoded data words defining measurement-sequence data words, one or more barcode-encoded data words being associated with each of the magnetic-resonance measurement sequences which the spectrometer is programmable to perform to constitute measurement-sequence specification information sufficient to specify the measurement sequence at least to the extent of permitting the control-program identifier associated with a measurement-sequence control program which specifies the measurement sequence to be identified, the spectrometer controller being adapted to receive signals from the barcode reader representative of the one or more barcode-encoded measurement sequence data words which constitute measurement-sequence specification information specifying a measurement sequence and to recall and execute the measurement-sequence control program identified by the control-program identifier identified in the measurement-sequence specification information; and (h) at least one measurement-sequence-selection barcode table having a plurality of barcode-encoded measurement-sequence data words arranged on it, each barcode-encoded measurement-sequence data word on the barcode table being selectively readable by a user with the barcode reader to transmit signals to the spectrometer controller representative of the measurement-sequence data word, the measurement-sequence-selection barcode table having a plurality of measurement sequences associated with it which the spectrometer is programmable to perform, each of the measurement sequences associated with the barcode table being specifiable by magnetic-sequence specification information constituted by one or more of the barcode-encoded measurement-sequence data words included on the barcode table, so that a user can cause the spectrometer to selectively perform a magnetic-resonance measurement sequence specified by one of the measurement-sequence control programs associated with the measurement-sequence selection barcode table by reading a corresponding one or more of the barcode-encoded measurement-sequence data words on the measurement-sequence-selection barcode table with the barcode reader.

8. The magnetic-resonance spectrometer according to claim 7 in which the barcode reader is a hand-holdable barcode-reader wand connected to the instrument controller by means of a flexible signal-transmission cable.

9. The magnetic-resonance spectrometer according to claim 8 in which the magnetic-resonance spectrometer includes a console having a control panel, the barcode-reader wand being connected to the console by the signal-transmission cable and the measurement-sequence-selection barcode table being removably mountable on the control panel at a location where the barcode-encoded measurement-sequence data words arranged on the barcode table may be read by the barcode reader wand.

10. The magnetic-resonance spectrometer according to claim 9 in which the instrument is a pulse/Fourier-transform NMR spectrometer.

* * * * *